US 8,753,965 B2

(12) United States Patent
Avouris et al.

(10) Patent No.: US 8,753,965 B2
(45) Date of Patent: Jun. 17, 2014

(54) GRAPHENE TRANSISTOR WITH A SELF-ALIGNED GATE

(75) Inventors: Phaedon Avouris, Yorktown Heights, NY (US); Damon B. Farmer, White Plains, NY (US); Yu-Ming Lin, West Harrison, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/602,117

(22) Filed: Sep. 1, 2012

(65) Prior Publication Data

US 2012/0329260 A1 Dec. 27, 2012

Related U.S. Application Data

(62) Division of application No. 12/876,454, filed on Sep. 7, 2010, now Pat. No. 8,344,358.

(51) Int. Cl.
*H01L 21/3205* (2006.01)

(52) U.S. Cl.
USPC .................................. 438/586; 257/E21.051

(58) Field of Classification Search
USPC ................ 438/586; 257/24, 57, 29, E21.051, 257/E29.082; 977/734
See application file for complete search history.

(56) References Cited

U.S. PATENT DOCUMENTS

| 7,170,120 B2 | 1/2007 | Datta et al. | |
| 7,492,015 B2 | 2/2009 | Chen et al. | |
| 8,106,383 B2 | 1/2012 | Jenkins | |
| 2008/0128760 A1* | 6/2008 | Jun et al. | 257/280 |
| 2008/0293228 A1 | 11/2008 | Kalburge | |
| 2009/0032804 A1 | 2/2009 | Kalburge | |
| 2009/0174435 A1 | 7/2009 | Stan et al. | |
| 2009/0221130 A1 | 9/2009 | Asano | |
| 2010/0012912 A1* | 1/2010 | Schricker | 257/2 |
| 2010/0021708 A1 | 1/2010 | Kong et al. | |
| 2010/0051897 A1* | 3/2010 | Chen et al. | 257/9 |
| 2010/0086875 A1 | 4/2010 | Wang et al. | |
| 2010/0127271 A1* | 5/2010 | Daniel et al. | 257/72 |

OTHER PUBLICATIONS

Lin, Y.M. et al., "100-GHz Transistors from Wafer-Scale Epitaxial Graphene" Science (2010) pp. 662, vol. 327.
Javey, A. et al., "Self-Aligned Ballistic Molecular Transistors and Electrically Parallel Nanotube Arrays" Nano Letters (2004) pp. 1319-1322, vol. 4(7).
Meric, I. et al., "Current Saturation in Zero-Bandgap, Top-Gated Graphene Field-Effect Transistors" Nature Nanotechnology (2008) pp. 654-659, vol. 3.
International Search Report dated Nov. 3, 2011, issued in corresponding International Application No. PCT/US2011/044619.

* cited by examiner

*Primary Examiner* — Selim Ahmed
(74) *Attorney, Agent, or Firm* — Scully, Scott, Murphy & Presser, P.C.; Vazken Alexanian

(57) ABSTRACT

A method of forming a transistor structure is provided. The method includes forming a graphene layer on an insulating layer; forming a stack of a first metal portion and a second metal portion over the graphene layer, wherein sidewalls of the first metal portion are vertically coincident with sidewalls of the second metal portion; and laterally offsetting the sidewalls of the first metal portion relative to the sidewalls of the second metal portion by a lateral distance.

17 Claims, 8 Drawing Sheets

US 8,753,965 B2

GRAPHENE TRANSISTOR WITH A SELF-ALIGNED GATE

CROSS REFERENCE TO RELATED APPLICATION

This application is a divisional of U.S. patent application Ser. No. 12/876,454, filed Sep. 7, 2010 the entire content and disclosure of which is incorporated herein by reference.

STATEMENT REGARDING FEDERALLY SPONSORED RESEARCH OR DEVELOPMENT

This disclosure was made with government support under Defense Advanced Research Project Agency (DARPA) CERA Contract No. FA8650-08-C-7838 awarded by the U.S. Department of Defense. The government has certain rights in this disclosure.

BACKGROUND

The present disclosure relates to a graphene device, and particularly to a graphene transistor having a self-aligned gate and methods of manufacturing the same.

The high mobility of charge carriers in graphene combined with the ability to modulate the carrier concentration by an external electric field has made graphene-based field effect transistors (FETs), or "graphene FETs," promising candidates for future high frequency applications. Recently, graphene FETs have been demonstrated to operate at cut-off frequencies ($f_T$) as high as 100 GHz. Additional increases in $f_T$ may be achievable through further improvement of both the constituent device materials and the device design. One of the critical factors currently limiting the performance of graphene FETs is the parasitic series resistance between the source/drain contacts and the gated graphene channel.

Graphene FETs include access regions in a graphene layer, which are between a gate and source/drain electrodes of a graphene-based field effect transistor. The access regions serve to reduce the parasitic capacitance between the gate and the source/drain electrodes. However, the access regions inevitably increase the resistance of the graphene FET, thereby reducing the current through the graphene FETs and limiting the device performance. It is therefore desirable to minimize as much as possible the access resistance (RA), which is the resistance of the access regions of a graphene FET. Reduction of the access resistance is especially crucial to scale down graphene devices because the access resistance can become comparable to the resistance of the gated channel and adversely affect the device behavior significantly as the device dimensions shrink.

The access resistance of conventional silicon-based FETs can be reduced by doping ungated regions through ion implantation to form source/drain regions having a high electrical conductivity. For example, a silicon nitride spacer can be deposited along the sidewall of a gate electrode, followed by the formation of highly doped source/drain regions by ion implantation. In the case of a graphene transistor, however, ion implantation cannot be employed because implanted dopant ions readily and inevitably destroy the fragile lattice structure of the graphene layer.

BRIEF SUMMARY

A graphene-based field effect transistor includes source and drain electrodes that are self-aligned to a gate electrode. A stack of a seed layer and a dielectric oxide layer is deposited over a patterned graphene layer. A first metal layer and a second metal layer are formed over a gate region of the dielectric oxide layer and lithographically patterned to form a conductive material stack of a first metal portion and a second metal portion. The first metal portion is laterally etched employing the second metal portion, and exposed portions of the dielectric oxide layer are removed to form a gate structure in which the second metal portion overhangs the first metal portion. The seed layer is removed and the overhang is employed to shadow proximal regions around the gate structure during a directional deposition process to form source and drain electrodes that are self-aligned and minimally laterally spaced from edges of the gate electrode.

The gate electrode is aligned to the source and drain electrodes without the constraints inherent in lithographic alignment procedures. Thus, the lateral spacing between the sidewalls of the first electrode and the source/drain electrodes can be a sublithographic dimension. The bilayer metal gate stack, in which the second metal portion overhangs the first metal portion, is employed in this disclosure to produce geometry including an undercut in the gate stack, thereby enabling the lateral isolation between the gate electrode and the source/drain electrodes.

According to an aspect of the present disclosure, a transistor structure includes: a graphene layer located on an insulating layer; a first metal portion overlying a portion of the graphene layer; a second metal portion contacting and overhanging the first metal portion; a first electrode contacting a portion of the graphene layer and laterally offset from a first sidewall of the first metal portion by a lateral spacing; and a second electrode contacting another portion of the graphene layer and laterally offset from a second sidewall of the first metal portion by the lateral spacing;

According to another aspect of the present disclosure, a method of forming a transistor structure includes: forming a graphene layer on an insulating layer; forming a stack of a first metal portion and a second metal portion over the blanket gate dielectric layer, wherein sidewalls of the first metal portion are vertically coincident with sidewalls of the second metal portion; and laterally offsetting the sidewalls of the first metal portion relative to the sidewalls of the second metal portion by a lateral distance.

DETAILED DESCRIPTION

Figure 1:
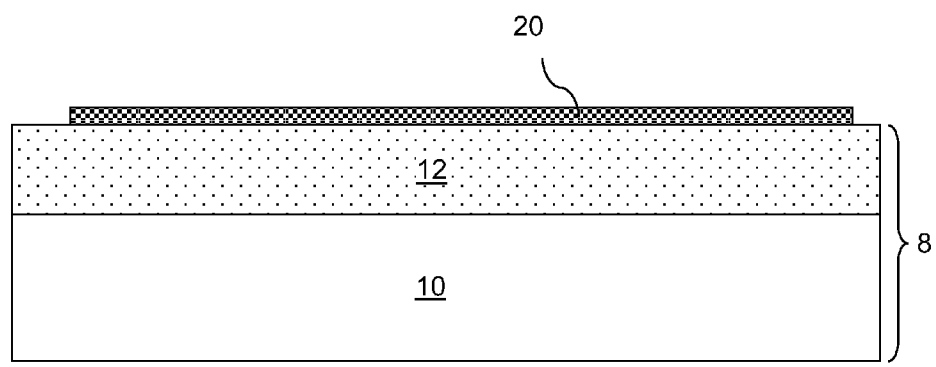
FIG. 1 is a vertical cross-sectional view of an exemplary structure after formation of a graphene layer.

As stated above, the present disclosure relates to a graphene transistor having a self-aligned gate and methods of manufacturing the same, which are now described in detail with accompanying figures. It is noted that like reference numerals refer to like elements across different embodiments.

Figure 1A:
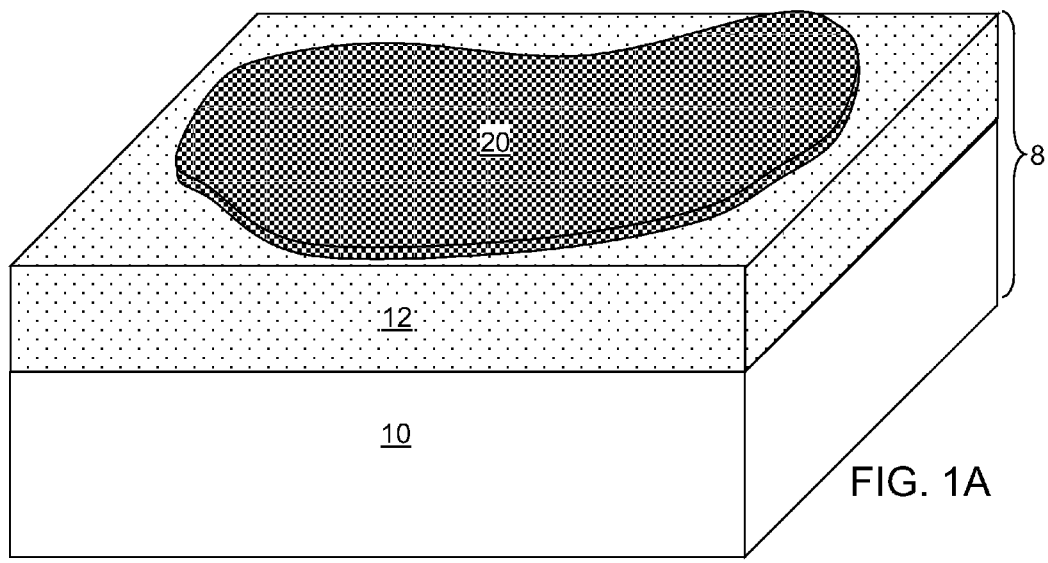
FIG. 1A is a bird's eye view of the exemplary structure of FIG. 1.

Referring to FIGS. 1 and 1A, an exemplary structure according to the present disclosure includes a graphene layer 20 formed on a substrate 8. The substrate 8 includes an insulating layer 12 located at a top portion thereof. The insulating layer 12 includes a dielectric material that does not conduct electricity. For example, the insulating layer 12 may include silicon oxide, silicon nitride, a dielectric metal oxide such as aluminum oxide, a dielectric metal nitride, or a combination thereof. Optionally, the substrate 8 may additionally include at least substrate layer 10, which may be a semiconductor layer, a conductive layer, or another insulating layer.

A graphene layer 20 is formed on the topmost surface of the insulating layer 12 employing methods known in the art. For example, the graphene layer 20 may be deposited directly on the top surface of the insulating layer 12, or may be exfoliated from another substrate after formation and transferred on the top surface of the insulating layer 12.

Graphene is a structure consisting of carbon atoms as a two-dimensional sheet. A graphene monolayer has a thickness of about 0.34 nm. The graphene layer 20 can be a monolayer of a two-dimensional sheet. Alternately, the graphene layer 20 can be a stack of a plurality of two-dimensional monolayers of carbon, which typically do not exceed more than 10 monolayers. More typically, the graphene layer 20 is limited to less than 5 monolayers. Graphene provides excellent in-plane conductivity. Within each monolayer of graphene in the graphene layer 20, carbon atoms are arranged in a two-dimensional honeycomb crystal lattice in which each carbon-carbon bond has a length of about 0.142 nm.

Figure 2:
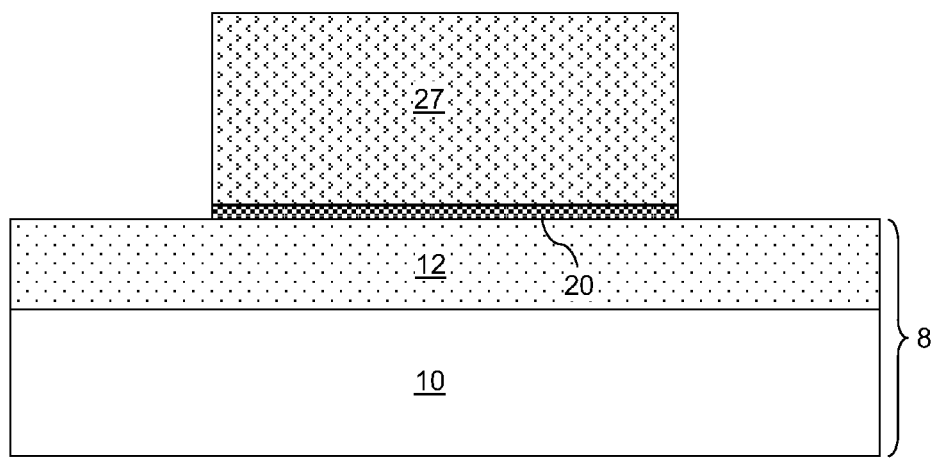
FIG. 2 is a vertical cross-sectional view of the exemplary structure after patterning of the graphene layer.
Figure 2A:
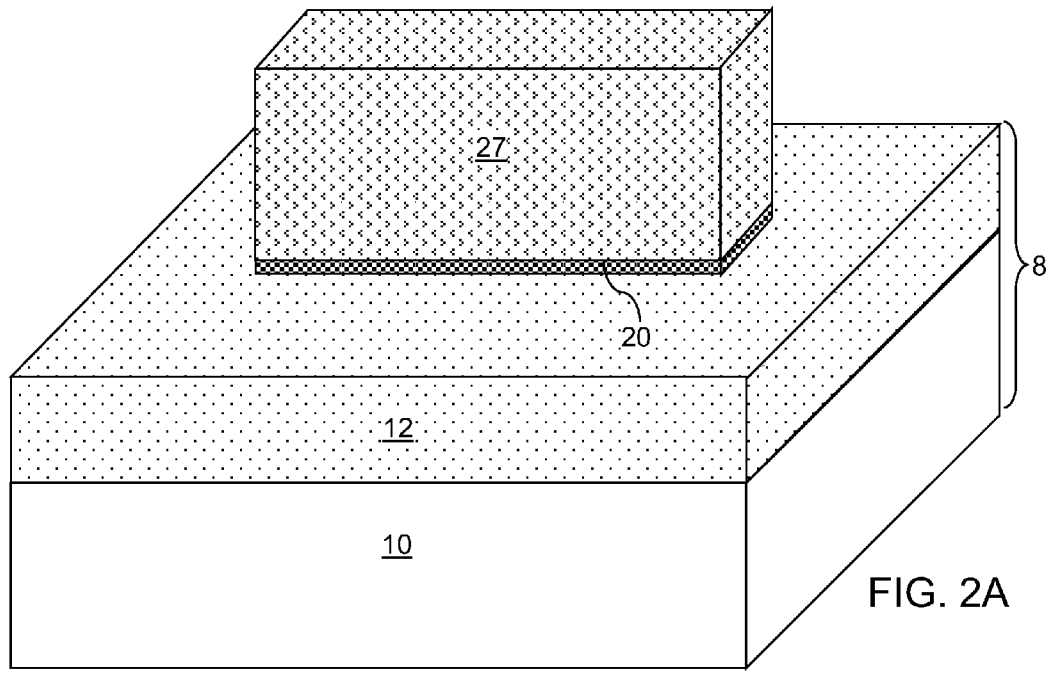
FIG. 2A is a bird's eye view of the exemplary structure of FIG. 2A.

Referring to FIGS. 2 and 2A, lithography techniques are employed to define the dimensions of a graphene based device to be subsequently formed. The lithographic patterning of the graphene layer 20 can be effected by masking the desired area of the graphene layer 20 with a photoresist 27, which can be, for example, a layer of poly(methyl methacrylate), i.e., PMMA. The photoresist 27 is lithographically patterned by exposure and development into a desired pattern, which can be, for example, a rectangular pattern such that the width of the patterned photoresist 27 is the desired width for the channel of a graphene based transistor to be subsequently formed. Employing the photoresist 27 as an etch mask, the exposed portions of the graphene layer 20 can be etched, for example, by subjecting to oxygen plasma the unmasked portions of the graphene layer 20. The photoresist 27 is then removed, for example, by dissolving in a solvent.

Figure 3:
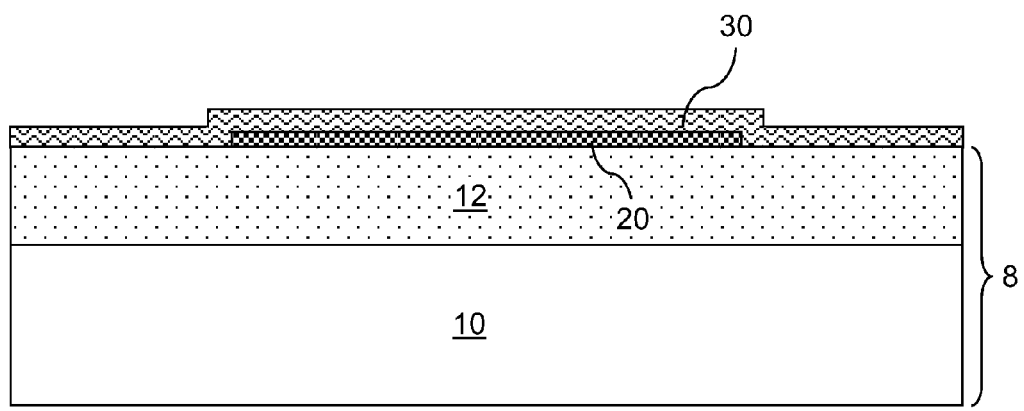
FIG. 3 is a vertical cross-sectional view of the exemplary structure after deposition of a seed layer.

Referring to FIG. 3, the graphene layer 20 is functionalized by depositing a dielectric seed layer 30. The dielectric seed layer 30 functionalizes the surfaces of the graphene layer 20 in order to promote a subsequent deposition of a dielectric oxide layer. In other words, subsequent deposition of a dielectric oxide layer may not proceed at all, or may proceed without formation of a continuous film of a dielectric oxide if the deposition of the dielectric seed layer 30 is omitted. Thus, "functionalization" of the surface of the graphene layer 20 enables subsequent deposition of a contiguous film of a dielectric oxide. The dielectric seed layer 30 is deposited directly on the surfaces of the graphene layer 20 and the exposed surfaces of the insulating layer 12.

In one embodiment, the dielectric seed layer 30 is an adsorbed monolayer of $NO_2$. The adsorbed monolayer of $NO_2$ can be formed by subjecting the exposed surface of the graphene layer 20 to an ambient including $NO_2$ gas. The $NO_2$ molecules become adsorbed to the exposed surface of the graphene layer 20 in a self-limiting reaction so that the thickness of the $NO_2$ molecules saturates at a single monolayer. The formation of a $NO_2$ monolayer functionalizes the graphene layer 20 so that a dielectric oxide can be subsequently deposited on the adsorbed $NO_2$ monolayer.

In another embodiment, the dielectric seed layer 30 includes a polymer layer. Non-limiting exemplary polymer materials for the dielectric seed layer 30 include polymer-bound 9-anthracene methanol (polysen) and polyvinyl alcohol (PVA). Such polymers have the effect of functionalizing the graphene layer 20 so that a dielectric metal oxide layer can be contiguously deposited in a subsequent processing step.

In yet another embodiment, the dielectric seed layer 30 can be formed by deposition of a layer of nanoscale metal particles and subsequently oxidizing the nanoscale metal particles. Such nanoscale metal particles have a maximum dimension that does not exceed 2 nm, and typically, does not exceed 1 nm. The nanoscale metal particles can be deposited by physical vapor deposition (PVD), i.e., sputtering in a vacuum ambient or in inert ambient. Subsequently, the deposited nanoscale metal particles are subjected to an oxidizing ambient, e.g., an oxygen-containing ambient, to induce the oxidation of the nanoscale metal particles. A dielectric oxidized metal, i.e., a dielectric metal oxide, with extremely fine grain size (on the order of a nanometer) is formed by converting the nanoscale metal particles into a dielectric metal oxide. Typically, due to the statistical nature of the deposition of the nanoscale metal particles, the thickness of the dielectric metal oxide is non-uniform at an atomic level, i.e., the dielectric metal oxide has an atomically non-uniform thickness. An exemplary dielectric metal oxide that may be formed in this manner includes, but is not limited to, aluminum oxide ($Al_2O_3$). The dielectric metal oxide has the effect of functionalizing the graphene layer 20 so that additional dielectric metal oxide layer can be contiguously deposited in a subsequent processing step.

The thickness of the dielectric seed layer 30 can be from 0.6 nm to 10 nm, and typically from 1 nm to 2 nm, although the thickness ranges can vary depending on the specific type of the dielectric layer 30 as illustrated in the various embodiments described above.

Figure 4:
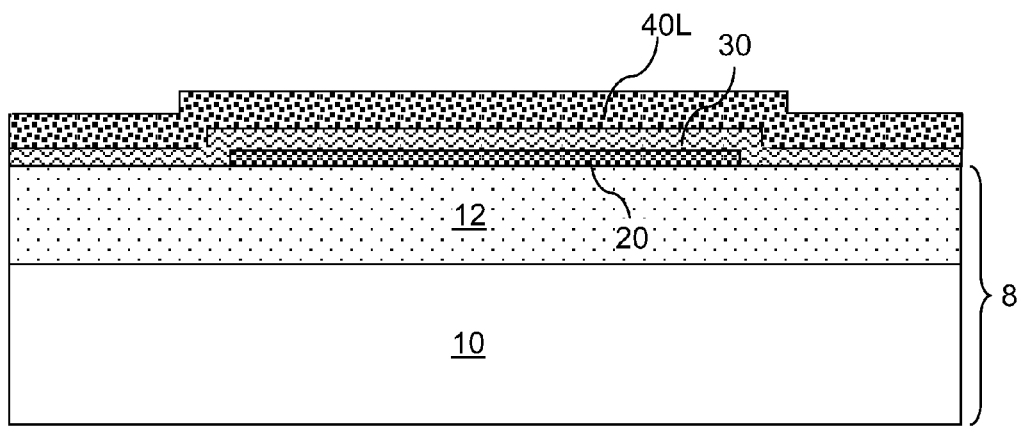
FIG. 4 is a vertical cross-sectional view of the exemplary structure after deposition of a blanket gate dielectric layer.

Referring to FIG. 4, a blanket gate dielectric layer 40L is deposited on the dielectric seed layer 30. In one embodiment, the blanket gate dielectric layer 40L is a dielectric metal oxide layer. The dielectric metal oxide layer can be deposited employing methods known in the art including, but not limited to, chemical vapor deposition (CVD), atomic layer deposition (ALD), or a combination of thereof. The dielectric metal oxide layer may include a high-k dielectric material having a dielectric constant greater than 4.0, or any suitable combination of these materials. Exemplary high-k dielectric materials include dielectric metal oxides and dielectric metal oxynitrides such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

In another embodiment, the blanket gate dielectric layer 40L can be a silicon oxide layer, a silicon nitride layer, a silicon oxynitride layer, or a combination thereof. In this embodiment, the blanket gate dielectric layer 40L can be deposited by plasma enhanced chemical vapor deposition (PECVD) or low pressure chemical vapor deposition (LPCVD).

The thickness of the blanket gate dielectric layer 40L may be from 0.6 nm to 20 nm, and typically from 1 nm to 3 nm, although lesser and greater thicknesses can also be employed. Other dielectric material can also be employed for the blanket gate dielectric layer 40 provided that the combination of the dielectric seed layer 30 and the blanket gate dielectric layer 40L does not significantly degrade the electronic transport properties of the graphene layer 20 such as the mobility of electrons in the graphene layer 20.

Figure 5:
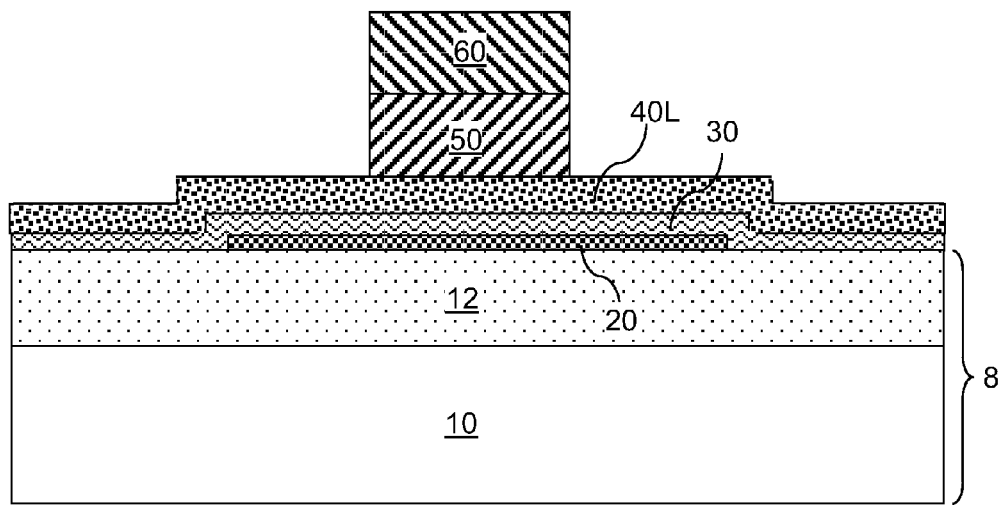
FIG. 5 is a vertical cross-sectional view of the exemplary structure after formation of a stack of a first metal portion and a second metal portion.

Referring to FIG. 5, a stack of a first metal portion 50 and a second metal portion 60 is formed by depositing a first metal layer and a second metal layer as blanket metal layers sequentially, and by lithographically patterning the second metal layer and the first metal layer in a subsequent processing step. The first metal layer includes a first metal, and the second metal layer includes a second metal that is different from the first metal. As used herein, a "metal" refers to an elemental metal, an intermetallic alloy of at least two elemental metals, a conductive metal oxide including at least one elemental metal, a conductive metal nitride including at least one metal, any other metal compound that is electrically conductive, or a combination thereof. The first metal and the second metal are electrical conductors, i.e., has an electrical conductivity greater than $10^3$ siemens per centimeter. The first metal layer and the second metal layer can be deposited, for example, by physical vapor deposition (PVD), chemical vapor deposition (CVD), vacuum evaporation, electroplating (provided a conductive seed layer is first formed), electroless plating (provided a conductive seed layer is first formed), or a combination thereof. The thickness of the first metal layer 50 can be from 5 nm to 100 nm, and typically from 10 nm to 50 nm, although lesser and greater thicknesses can also be employed. The thickness of the second metal layer 50 can be from 5 nm to 1,000 nm, and typically from 10 nm to 200 nm, although lesser and greater thicknesses can also be employed.

The stack of the first metal layer and the second metal layer is lithographically patterned. For example, a photoresist (not shown) can be applied to the top surface of the second metal layer and lithographically patterned to form a portion that overlies the central portion of the graphene layer 20. Employing the patterned photoresist as an etch mask, the exposed portions of the second metal layer and the first metal layer can be etched, for example, by an anisotropic ion etch. In a variation, a wet etch may be employed to pattern the second metal layer and the first metal layer depending on the thicknesses of the second and first metal layers and the lateral dimensions of the second metal portion and the first metal portion. The remaining portion of the first metal layer is the first metal portion 50, and the remaining portion of the second metal layer is the second metal portion 60. If an anisotropic etch is employed to pattern the second metal portion 60 and the first metal portion, the sidewalls of the second metal portion 60 can be vertically coincident with the sidewalls of the first metal portion 50. In other words, the sidewalls of the second metal portion 60 can coincide with sidewalls of the first metal portion 50 in a top-down view.

The first metal and the second metal are selected such that there exists an etch chemistry that selectively removes the first metal without significantly etching the second metal. Further, the first metal is selected such that the first metal portion 50 is attached to the blanket gate dielectric layer 40L with sufficient adhesion strength and does not delaminate during subsequent processing steps. The second metal is selected so that the second metal portion 60 remains intact during a subsequent etch step that removes portions of the blanket gate dielectric layer. In one embodiment, the first metal can be selected to exhibit a finite, but small, solubility in an etch solution employed to remove exposed portions of the blanket gate dielectric layer 40L in a subsequent etch step.

In one embodiment, the second metal includes a noble metal, and the first metal does not include a noble metal. As used herein, a "noble metal" refers to any elemental metal selected from ruthenium, rhodium, palladium, silver, osmium, iridium, platinum, and gold or an alloy of at least two elemental metals selected from ruthenium, rhodium, palladium, silver, osmium, iridium, platinum, and gold.

In one embodiment, the second metal portion 60 can be composed of an elemental noble metal selected from ruthenium, rhodium, palladium, silver, osmium, iridium, platinum, and gold, and the first metal portion 50 does not include an elemental noble metal.

In one embodiment, the first metal portion 50 can be composed of a material selected from copper, aluminum, nickel, cobalt, and a combination thereof.

Figure 6:
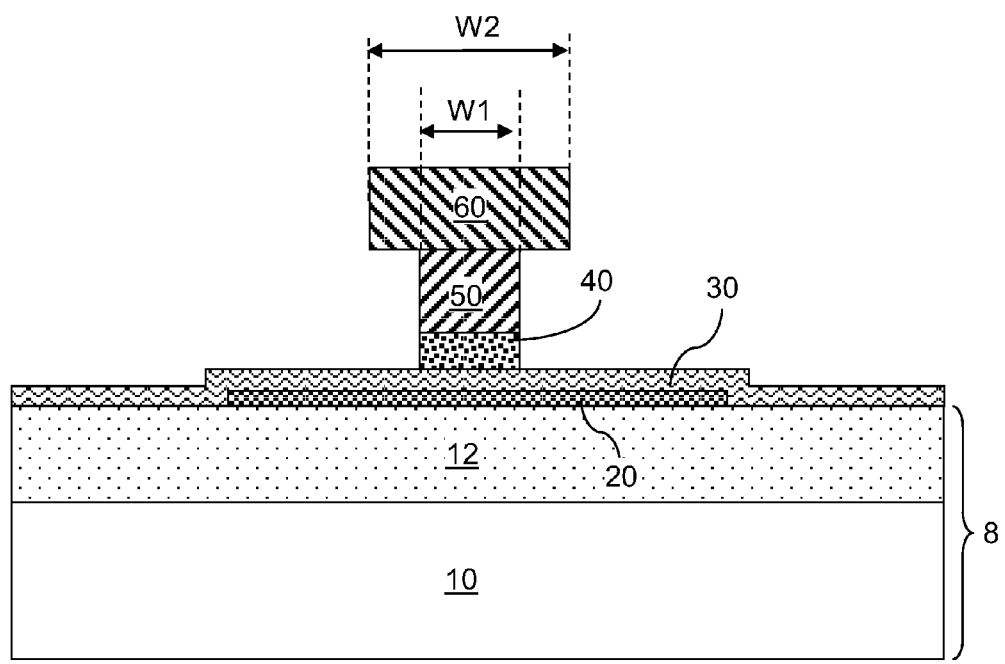
FIG. 6 is a vertical cross-sectional view of the exemplary structure after lateral recessing of the first metal portion and removal of exposed portions of the blanket gate dielectric layer.

Referring to FIG. 6, the sidewalls of the first metal portion 50 are laterally recessed relative to the sidewalls of the second metal portion and the exposed portions of the blanket gate dielectric layer 40L are removed. In one embodiment, the lateral recessing of the sidewalls of the first metal portion 50 and the removal of the exposed portions of the blanket gate dielectric layer 40L are performed simultaneously. In another embodiment, the lateral recessing of the sidewalls of the first metal portions 50 precedes the removal of the exposed portions of the blanket gate dielectric layer 40L. In yet another embodiment, the removal of the exposed portions of the blanket gate dielectric layer precedes the lateral recessing of the sidewalls of the first metal portion 50. The illustrated exemplary structure corresponds to the embodiment in which the lateral recessing of the sidewalls of the first metal portions 50 occurs simultaneously with, or precedes, the removal of the exposed portions of the blanket gate dielectric layer 40L.

The sidewalls of the first metal portion 50 are laterally offset relative to the sidewalls of the second metal portion 60 by a lateral distance, which is the same on all sidewalls of the first metal portion 50. Thus, second metal portion 60 overhangs the first metal portion 50 by an overhang distance that is constant around the entirety of sidewalls of the first metal portion 50. The overhang distance is the same as the lateral offset distance. The overhang distance is constant around the entirety of sidewalls of the first metal portion 50.

The blanket gate dielectric layer 40L is patterned employing the first metal portion 50 as an etch mask. A gate dielectric 40 straddling over a center portion of the graphene layer 20 is formed from a remaining portion of the blanket gate dielectric layer 40L. The first metal portion 50 contacts the entirety of the upper surface of the gate dielectric 40 and the dielectric seed layer 30 contacts the entirety of the bottom surface of the gate dielectric 40. The lateral dimensions of the gate dielectric 40 coincide with the lateral dimensions of the first metal portion 50 (ignoring an insignificant amount of undercut in the gate dielectric 40 that may be introduced during processing). If the lateral recessing of the first metal portion 50 occurs simultaneously with, or proceeds, the etching of the blanket gate dielectric layer, the sidewalls of the gate dielectric 40 is laterally offset relative to the sidewalls of the second metal portion 60 by the same lateral distance as the sidewalls of the first metal portion 50.

In a non-limiting illustrative example, the first metal can be titanium and phosphoric acid can be employed to simultaneously provide lateral recessing of the sidewalls of the first metal portion 50 and the removal of the exposed portions of the blanket gate dielectric layer 40L. Because titanium has a finite yet significant solubility in phosphoric acid, the sidewalls of the first metal portion 50 is laterally recessed to yield a "mushroom" profile. During this etch, the exposed portions of the blanket gate dielectric layer 40L are removed because typical metal oxides have a comparable etch rate as, or a greater etch rate than, titanium in phosphoric acid. In general, the second metal is inert to the etchant employed to remove the exposed portions of the blanket gate dielectric layer 40, while the first metal may exhibits a finite but limited etch rate during the etching either in the form of solubility to a wet etch solution or in the form of reactivity to etchant gases in a dry etch. The lateral recessing of the sidewalls of the first metal portion 50 relative to the sidewalls of the second metal portion 60 yields the mushroom profile, in which the first width w1 of the first metal portion 50 is less than the second width w2 of the second metal portion 60. The overhang distance is half of the difference between the second width w2 and the first width w1. The overhang distance can be controlled by the etch time and/or the etch chemistry.

The overhang distance is not limited by lithographic constraints, and consequently can be a sublithographic dimension. A sublithographic dimension refers to a dimension that is smaller than the "critical dimension," which is the minimum dimension that can be printed on a photoresist employing available single exposure lithographic techniques. As of 2010, the critical dimension is about 30 nm. The overhang distance can be from 2 nm to 100 nm, and typically from 3 nm to 30 nm, although lesser and greater overhang distances can also be employed.

Figure 7:
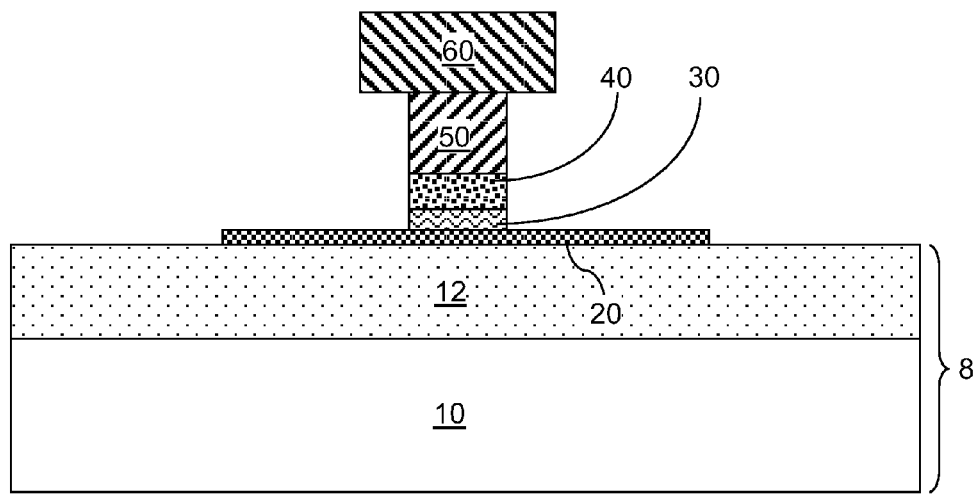
FIG. 7 is a vertical cross-sectional view of the exemplary structure after removal of the dielectric seed layer.

Referring to FIG. 7, the exposed portions of the dielectric seed layer 30 is removed using etchants. If the dielectric seed layer 30 includes a monolayer of $NO_2$, an anneal at an elevated temperature can desorb the $NO_2$ molecules from the exposed portions of the dielectric seed layer 30. If the dielectric seed layer 30 includes a polymer, a suitable solvent can be employed to remove the exposed portions of the dielectric seed layer 30. If the dielectric seed layer 30 includes a dielectric oxidized metal (i.e., a dielectric metal oxide), the exposed portions of the dielectric seed layer 30 can be removed by an etch, which can be a wet etch or by a dry etch (such as an anisotropic reactive ion etch). In a non-limiting illustrative example, if aluminum oxide is used as the dielectric seed layer 30, the exposed portions of the dielectric seed layer 30 can be removed in phosphoric acid.

The exposed portions of the dielectric seed layer 30 are the portions that are not covered by the gate dielectric 40. Two portions of the graphene layer 30 are exposed after removal of the exposed portions of the dielectric seed layer 30. By removing the exposed portions of the dielectric seed layer 30, surfaces of the graphene layer 20 become exposed at both ends of the graphene layer 20 around the gate stack, which includes the remaining portion of the dielectric seed layer 30, the gate dielectric 40, the first metal portion 50, and the second metal portion 60. The combination of the dielectric seed layer 30 and the gate dielectric 40 electrically separates the graphene layer 20 from the first metal portion 50 and the second metal portion 60.

Figure 8:
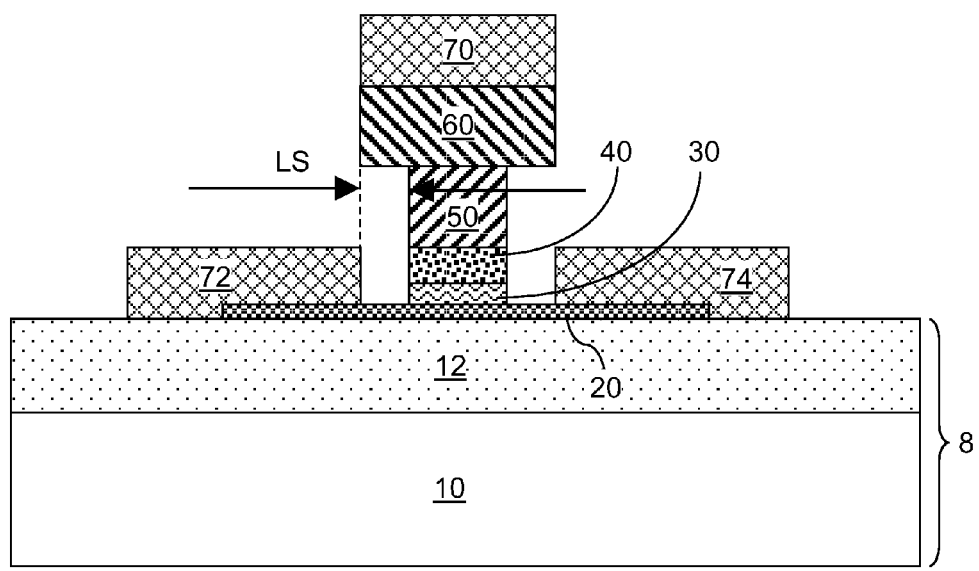
FIG. 8 is a vertical cross-sectional view of the exemplary structure after formation of contact metal portions, which constitute a gate electrode, a source electrode, and a drain electrode.
Figure 8A:
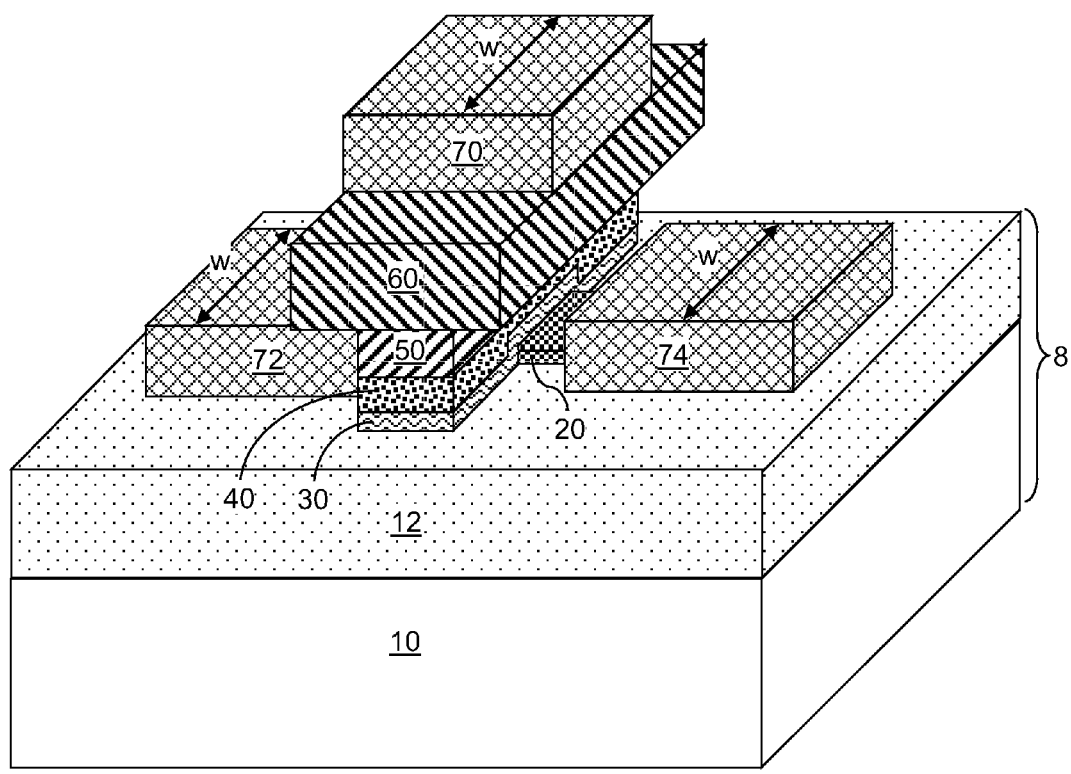
FIG. 8A is a bird's eye view of the exemplary structure of FIG. 8.

Referring to FIGS. 8 and 8A, contact metal portions are deposited on the exemplary structure employing a line-of-sight metal deposition technique and a subsequent lithographic patterning. A line-of-sight metal deposition technique can be any deposition technique that provides a highly directional beam of metal atoms or metal particles. For example, the line-of-sight metal deposition technique can be vacuum evaporation from a thermal evaporation source such as an electron beam source or an effusion cell, or can be a highly collimated physical vapor deposition (PVD) process. The collimation of the metal atoms or metal particles is such that the maximum deviation of the direction of the particle beam is less than the arctangent of the number that is equal to the overhang distance divided by the sum of the thicknesses of the dielectric seed layer 30, the gate dielectric 40, and the first metal portion 50. Preferably, the deviation of the direction of the particle beam from the vertical direction is minimized in order to reduce penumbra areas of the metal particle beam. A metal layer deposited by the line-of-sight deposition technique is subsequently lithographically patterned to form the contact metal portions. Optionally, a mask including a simple rectangular pattern having a width w can be employed to pattern the contact metal portions, in which case all of the contact metal portions can have the same width w.

The contact metal portions include a gate electrode 70, a source electrode 72, and a drain electrode 74. The gate electrode 70 is formed only on a portion of the top surface of the second metal portion 60. The source electrode 72 and the drain electrode 74 are formed directly on a portion of the graphene layer 20. The sidewall of the source electrode 72 that is proximate to the sidewalls of the first metal portion 50 is herein referred to as a proximate sidewall of the source electrode 72. The sidewall of the drain electrode 74 that is proximate to the sidewalls of the first metal portion 50 is herein referred to as a proximate sidewall of the drain electrode 74. The proximate sidewall of the source electrode 72 and the proximate sidewall of the drain electrode 74 are laterally offset from sidewalls of the first metal portion 50 by a lateral spacing LS.

The gate electrode 70, the source electrode 72, and the drain electrode 74 include a conductive material, which is typically a metal. The gate electrode 70, the source electrode 72, and the drain electrode 74 have the same thickness and the same composition. The thickness of the gate electrode 70, the source electrode 72, and the drain electrode 74 is less than the total thickness of the stack of the dielectric seed layer 30, the gate dielectric 40, and the first metal portion 50 to avoid contact (and a resultant electrical short) with the second metal portion 60. The thickness of the gate electrode 70, the source electrode 72, and the drain electrode 74 can be from 5 nm to 100 nm, and typically from 10 nm to 50 nm, although lesser and greater thicknesses can also be employed.

In one embodiment, the lateral spacing LS can be the same as the overhang distance of the second metal portion 60 over the first metal portion 50 if the metal particle beam is highly directional. In another embodiment, the lateral spacing LS can be less than, but substantially the same as, the overhang distance of the second metal portion 60 over the first metal portion 50, with the deviation from the ideal value attributable to process parameters involving the angular distribution of the directions of the metal particles in the metal particle beam and the vertical distance between the top surfaces of the source electrode 72 and the drain electrode 74 and the bottom surface of the second metal portion 60. The source electrode 72 and the drain electrode 74 are self-aligned to the gate stack (30, 40, 50, 60), and is separated from the "stem" of the gate stack by the lateral spacing LS, which is determined by the lateral offset distance, i.e., the overhang distance. The stem of the gate stack refers to the stack of the dielectric seed layer 30, the gate dielectric 40, and the first metal portion 50, that have the lateral dimension of the first width w1.

The exemplary structure is a self-aligned top-gated graphene-based field effect transistor, in which the stack of the first metal portion 50, the second metal portion 60, and the gate electrode 70 collectively functions as a gate terminal that controls the current flow of charge carriers in the center portion of the graphene layer 20 that directly underlies the dielectric seed layer 30. The stack of the dielectric seed layer 30 and the gate dielectric 40 collectively functions as a dielectric material structure that electrically isolated the graphene layer 20 from the gate terminal (50, 60, 70). The dimension of the lateral spacing LS is not limited by any lithographic constraints, and can be a sublithographic dimension. Thus, the exemplary structure can be scaled without lithographic constraints.

Figure 9:
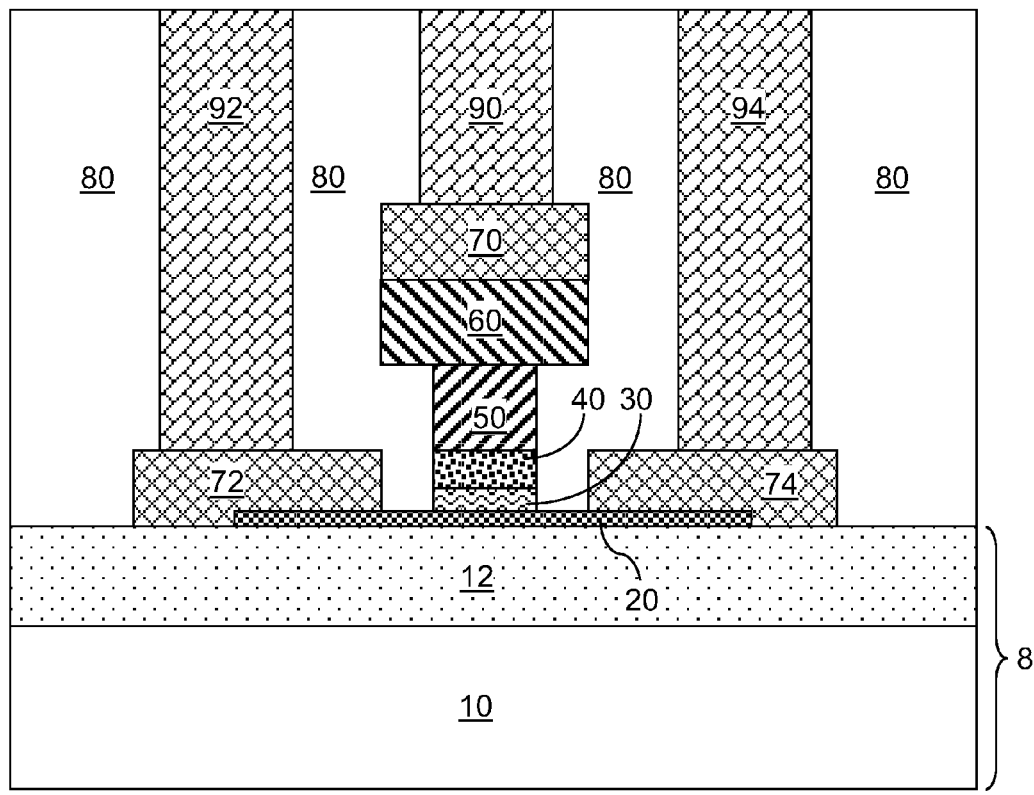
FIG. 9 is a vertical cross-sectional view of the exemplary structure after formation of a contact level dielectric material layer and conductive contact via structures.
Figure 9A:
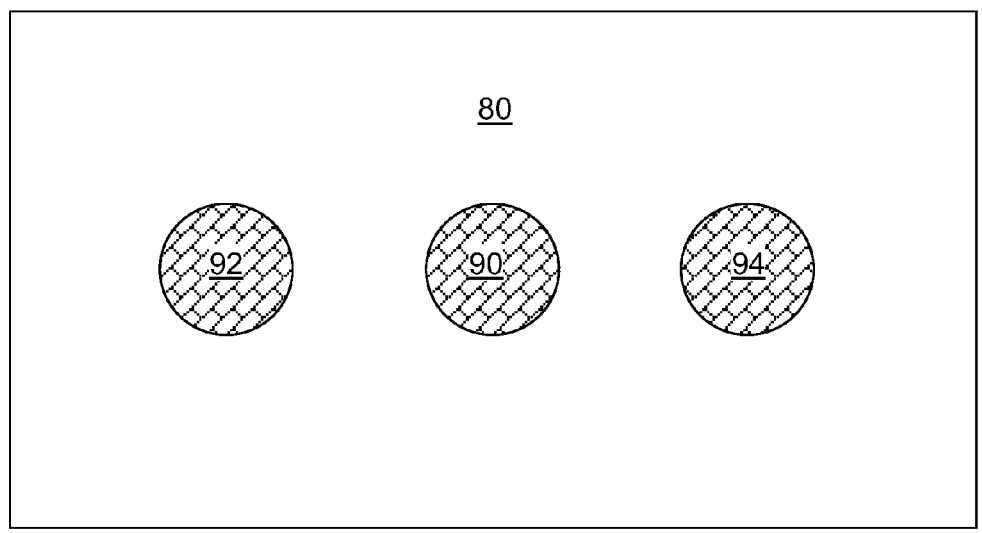
FIG. 9A is a top-down view of the exemplary structure of FIG. 9.

Referring to FIGS. 9 and 9A, a contact level dielectric material layer 80 and conductive contact via structures can be formed. The contact level dielectric material layer 80 can be a homogeneous dielectric material layer or can be a stack of a plurality of different dielectric material layers. The contact level dielectric material layer 80 contacts the first metal portion 50 and the first electrode 72 and the second electrode 74. The contact level dielectric material layer 80 contacts the graphene layer 20 at two portions. The area of contact at each of the two portions has a constant width that is the same as the lateral spacing LS (See FIG. 8). The contact level dielectric material layer 80 also contacts the sidewalls of the dielectric seed layer 30 and the gate dielectric 40.

The conductive contact via structures can be formed by etching via cavities in the contact level dielectric material layer 80 and filling the via cavities with a conductive material, followed by removal of the excess conductive material from above the top surface of the contact level dielectric material layer 80. The conductive contact via structures include a gate-side contact via structure 90 contacting the gate electrode 70, a source-side contact via structure 92 contacting the source electrode 72, and a drain-side contact via structure 94 contacting the drain electrode 74. The gate-side contact via structure 90, the source-side contact via structure 92, and the drain-side contact via structure 94 are embedded in the contact level dielectric material layer 80.

The method of the present disclosure does not employ any dielectric spacer on sidewalls of a gate stack. The advantages of this method include minimization of parasitic resistances and capacitances by the self-aligned placement of the source electrode 72 and the gate electrode 74 relative to a bottom portion of a gate terminal, i.e., the first metal portion 50. The minimization of the parasitic resistances and capacitances enhances the performance of the device for high-speed or high-frequency electronics. Further, the method of the present disclosure does not rely on any lithographic alignment to achieve the alignment among the gate terminal (50, 60, 70), the source electrode 72, and the drain electrode 74. Thus, the method of the present disclosure is amenable to low cost manufacturing.

In addition, because the method of the present disclosure does not employ any ion implantation doping, and consequently, does not cause any structural damages to the graphene lattice through implanted ions. Thus, the structural integrity of the graphene layer 20 is preserved during the manufacturing process, and degradation of the performance of the graphene device due to structural damages is avoided. The new approach avoids ion implantation doping. If wet etch or a high temperature anneal is employed to remove exposed portions of the dielectric seed layer 30, reactive ion etching on the surfaces of the graphene layer 20 can also be avoided Like ion implantation, reactive ion etching can damage the graphene lattice and degrade the resulting device performance. The method of the present disclosure provides processes that avoid use of reactive ion etching on the graphene layer 20. Further, the method of the present disclosure is compatible with use of a high-k dielectric material for the gate dielectric 40, which can enhance the performance of the graphene based transistor compared with devices employing a conventional silicon oxide based gate dielectric.

Figure 10:
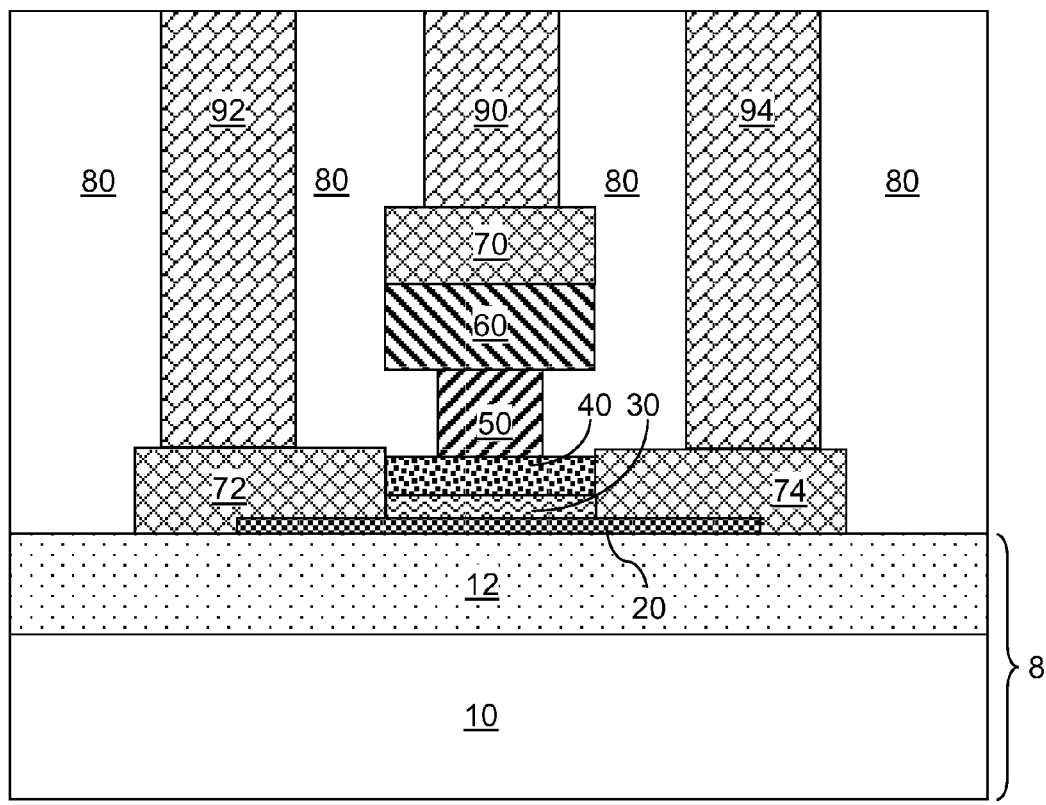
FIG. 10 is a vertical cross-sectional view of a variation of the exemplary structure.
Figure 10A:
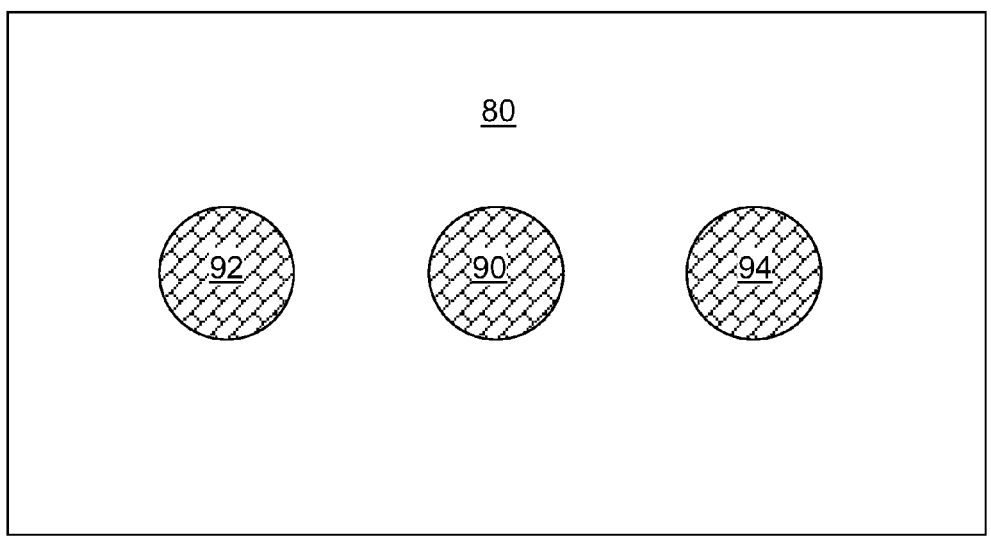
FIG. 10A is a top-down view of the exemplary structure of FIG. 10.

Referring to FIGS. 10 and 10A, a variation of the exemplary structure is shown. This variation of the exemplary structure can be obtained by etching exposed portions of the blanket gate dielectric layer 40L prior to laterally recessing the sidewalls of the first metal portion 50 at a processing step corresponding to FIG. 6. If the etchant employed to laterally recess the sidewalls of the first metal portion 50 etches the first metal selective to the material of the gate dielectric 40, the sidewalls of the first metal portion 50 can be laterally recessed relative to the sidewalls of the gate dielectric 40.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a transistor structure comprising:
forming a graphene layer directly on an upper surface of an insulating layer, wherein an entirety of a bottom surface of said graphene layer directly contacts said upper surface of said insulator layer;
forming a stack of a first metal portion and a second metal portion over said graphene layer, wherein said second metal portion directly contacts said first metal portion; and
laterally offsetting sidewalls of said first metal portion relative to sidewalls of said second metal portion by a lateral distance.

2. The method of claim 1, further comprising:
forming a blanket gate dielectric layer over said graphene layer, wherein said first metal portion is formed on said blanket gate dielectric layer; and
patterning said blanket gate dielectric layer employing said second first metal portion as an etch mask, wherein a gate dielectric straddling over said portion of said graphene layer is formed.

3. The method of claim 2, further comprising forming a dielectric seed layer directly on said graphene layer prior to forming said blanket gate dielectric layer.

4. The method of claim 3, wherein said dielectric seed layer includes an adsorbed monolayer of $NO_2$.

5. The method of claim 3, wherein said dielectric seed layer includes a polymer layer.

6. The method of claim 3, wherein said dielectric seed layer includes a dielectric oxidized metal having an atomically non-uniform thickness.

7. The method of claim 1, wherein said second metal portion overhangs said first metal portion by an overhang distance that is constant around the entirety of sidewalls of said first metal portion.

8. The method of claim 1, wherein said second metal portion includes an elemental noble metal selected from ruthenium, rhodium, palladium, silver, osmium, iridium, platinum, and gold, and said first metal portion does not include an elemental noble metal.

9. The method of claim 1, further comprising:
forming a first electrode contacting a portion of said graphene layer and laterally offset from a first sidewall of said first metal portion by said lateral distance; and
forming a second electrode contacting another portion of said graphene layer and laterally offset from a second sidewall of said first metal portion by said lateral distance.

10. The method of claim 9, further comprising forming a contact level dielectric material layer on said first metal portion and said first electrode and said second electrode.

11. The method of claim 10, further comprising:
forming a gate electrode contacting a top surface of said second metal portion;
forming a first contact via structure contacting said first electrode; and
forming a second contact via structure contacting said second electrode, wherein said first contact via structure and second contact via structure are formed within said contact level dielectric material layer in a same processing step.

12. The method of claim 2, wherein said blanket gate dielectric layer includes a dielectric metal oxide having a dielectric constant greater than 4.0.

13. The method of claim 1, wherein said second metal portion includes an elemental noble metal selected from ruthenium, rhodium, palladium, silver, osmium, iridium, platinum, and gold, and said first metal portion does not include an elemental noble metal.

14. The method of claim 11, wherein said first metal portion includes a material is selected from copper, aluminum, nickel, cobalt, and a combination thereof.

15. The method of claim 3, wherein said forming the dielectric seed layer comprises deposition of a layer of nanoscale metal particles and oxidizing the nanoscale metal particles.

16. The method of claim 1, wherein said forming the stack comprises depositing a first metal layer and a second metal layer as blanket metal layers sequentially, and lithographically patterning the second metal layer and the first metal layer in a subsequent processing step.

17. The method of claim 1, wherein said laterally offsetting said sidewalls of the first metal portion relative to said sidewalls of said second metal portion comprises a lateral wet etching processing.

* * * * *